United States Patent
Yueh et al.

(10) Patent No.: US 11,522,042 B2
(45) Date of Patent: Dec. 6, 2022

(54) METHOD OF MANUFACTURING TILED DISPLAY DEVICE

(71) Applicant: Innolux Corporation, Miao-Li County (TW)

(72) Inventors: Jui-Jen Yueh, Miao-Li County (TW); Kuan-Feng Lee, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 227 days.

(21) Appl. No.: 16/796,944

(22) Filed: Feb. 21, 2020

(65) Prior Publication Data

US 2021/0265457 A1 Aug. 26, 2021

(51) Int. Cl.
*H01L 27/32* (2006.01)
*G02F 1/1333* (2006.01)

(52) U.S. Cl.
CPC ...... *H01L 27/3293* (2013.01); *G02F 1/13336* (2013.01); *G02F 1/133354* (2021.01); *H01L 2227/323* (2013.01)

(58) Field of Classification Search
CPC .......... H01L 27/3293; H01L 2227/323; G02F 1/13336; G02F 1/133354; G02F 1/133308; G09F 9/3026
See application file for complete search history.

(56) References Cited

U.S. PATENT DOCUMENTS

| | | | |
|---|---|---|---|
| 6,476,886 B2 * | 11/2002 | Krusius | ............... G02F 1/13336 349/122 |
| 6,573,957 B1 | 6/2003 | Suzuki | |
| 6,665,043 B1 * | 12/2003 | Okuyama | ............. G02F 1/1333 349/190 |
| 2002/0001051 A1 | 1/2002 | Krusius et al. | |
| 2018/0226059 A1 | 8/2018 | Cross et al. | |

FOREIGN PATENT DOCUMENTS

| | | |
|---|---|---|
| CN | 102916035 | 2/2013 |
| WO | 2019099985 | 5/2019 |

OTHER PUBLICATIONS

"Search Report of Europe Counterpart Application", dated Jul. 5, 2021, p. 1-p. 8.
"Office Action of China Counterpart Application", dated Apr. 22, 2022, p. 1-p. 7.
"Office Action of China Counterpart Application", dated Sep. 13, 2022, p. 1-p. 8.

\* cited by examiner

*Primary Examiner* — Donald L Raleigh
(74) *Attorney, Agent, or Firm* — JCIPRNET

(57) ABSTRACT

A method of manufacturing a tiled display device is provided. In the method of manufacturing a tiled display device, a plurality of display panels are provided. Next, a plurality of alignment marks are provided. Afterwards, the plurality of display panels are tiled with reference to the plurality of alignment marks. The alignment marks are so arranged that the display panels are tiled to make all the same interpitches.

6 Claims, 7 Drawing Sheets

METHOD OF MANUFACTURING TILED DISPLAY DEVICE

BACKGROUND

Technical Field

The disclosure relates to a method of manufacturing a tiled electronic device, and more particularly to a method of manufacturing a tiled display device.

Description of Related Art

Currently, the alignment marks on adjacent display panels are used to align the display devices one by one. However, the risk of cumulative shift of the panel usually occurs in this method. Therefore, this method is not suitable for multi-panel arrangement. As a result, reducing the risk of cumulative shift and finding an efficient method for multi-panel arrangement are topics to be actively studied currently.

SUMMARY

The disclosure provides a method of manufacturing a tiled display device, the method is able to reduce the risk of cumulative shift.

According to an embodiment of the disclosure, in the method of manufacturing a tiled display device, a plurality of display panels are provided. Next, a plurality of alignment marks are provided. Afterwards, the plurality of display panels are tiled with reference to the plurality of alignment marks. The alignment marks are so arranged that the display panels are tiled to make all the same interpitches.

In order to make the above features and advantages of the disclosure more obvious, the following embodiment is described in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
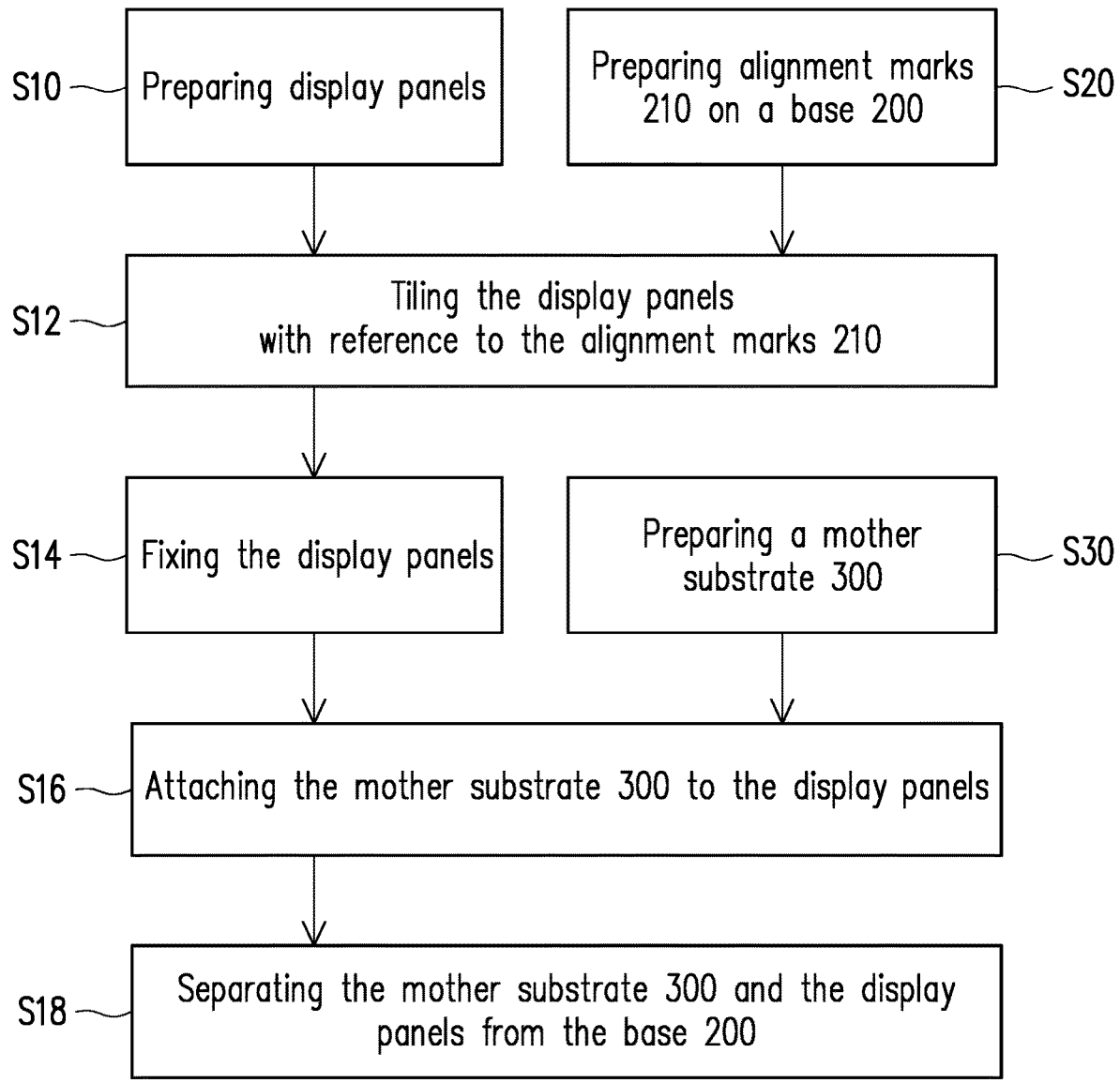
FIG. 1 is a flow chart illustrating the steps of a method of manufacturing a tiled display device according to an embodiment of the disclosure.

The disclosure can be understood with reference to the following exemplary embodiments and the accompanying drawings. For easy understanding and simplicity of drawings, some of the drawings in the disclosure depict only a portion of the display device, and specific components in the drawings are not drawn according to actual scales.

In the drawings, common characteristics of the methods, structures and/or materials used in specific exemplary embodiments are shown. However, the drawings are not limited to the structures or features of the following embodiments and the drawings should not be interpreted to define or limit the scopes or the properties of the descriptions in the exemplary embodiments. For instance, the relative dimension, thickness, and location of each film layer, region, and/or structure may be reduced or enlarged for clarity.

Certain terms are used throughout the description and the claims to refer to particular elements. People skilled in the pertinent art shall appreciate that electronic device manufacturers may use different names to denote the same element. The disclosure does not aim at distinguishing the elements with the same function but different names.

In the description and claims, the words "having," "including," and "comprising" are open-ended and therefore should be interpreted as "including but not limited to". Moreover, "first", "second", etc. mentioned in the specification and the claims are merely used to name the discrete elements or to differentiate different ranges or embodiments and therefore should not be regarded as limiting the upper or lower bound of the number of the components/devices and should not be used to limit the manufacturing sequence of components.

The directional terminologies mentioned in the detailed description, such as "top," "bottom," "front," "back," "left," or "right", etc., are used as a reference to the orientation of the drawings being described. Accordingly, the drawings and descriptions will be regarded as being illustrative in nature but not as being restrictive.

It should be understood that when an element or a film layer is referred to as being disposed "on" another element or another film layer or "connecting/bonding" another element or another film layer, the element or the film layer may be directly located on the other element or film layer or directly connected/bonded to the other element or film layer, or there may be an intervening element or film layer between the two elements (indirect connection/bonding). By contrast, when the element or the film layer is referred to as being "directly on" or "directly connected/bonded" to another element or another film layer, there is no intervening element nor film layer between the two elements. In addition, connecting or bonding two elements to each other may indicate both elements are fixed or at least one of the elements is movable.

The terms "about", "approximately", or "substantially", used herein are generally meant to fall within a range of 20%, or 10%, or 5%, or 3%, or 2%, or 1%, or 0.5% of a given value or range.

The tiled electronic device of the disclosure may include, for example, a display device, an antenna device, a sensing device, a touch display device, a curved display device, or a free shape display device, a foldable or flexible tiled electronic device or combination thereof. However, the disclosure is not limited thereto. The tiled electronic device may include, for example, a light emitting diode, a liquid crystal, a fluorescence, a phosphor, other suitable display media, or a combination thereof, but is not limited thereto. The light emitting diode may include, for example, an organic light emitting diode (OLED), an inorganic light emitting diode (LED), a sub-millimeter light emitting diode (mini LED), a micro light emitting diode (micro LED) or a quantum dot light emitting diode (QD, for example, QLED, QDLED), or other suitable materials or a combination thereof, but is not limited thereto. The antenna device may be, for example, a liquid crystal antenna, but is not limited thereto. It should be noted that the tilted electronic device can be any of the aforementioned combinations, but is not limited thereto. In addition, the appearance of the tilted electronic device can be rectangular, circular, polygonal, a shape with curved edges, or other suitable shapes. The tiled electronic device may have a peripheral system such as a driving system, a control system, a light source system, a shelf system, etc. to support a display device or an antenna device. The following is an example of a tiled display device.

In the following embodiments, the same or similar elements will be given the same or similar reference numerals, and the description thereof will be omitted. In addition, the features provided in different embodiments may be arbitrarily combined and applied without departing from the spirit of the disclosure, and the simple equivalent changes and modifications made in the descriptions or claims are still within the scope of the disclosure.

Figure 2:
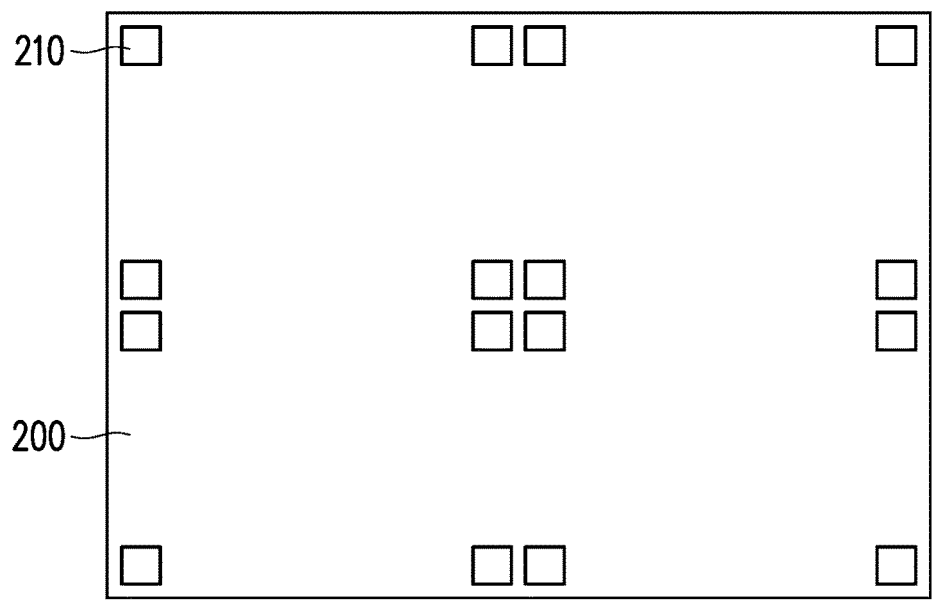
FIG. 2 is a schematic top view of a base according to an embodiment of the disclosure.
Figure 3:
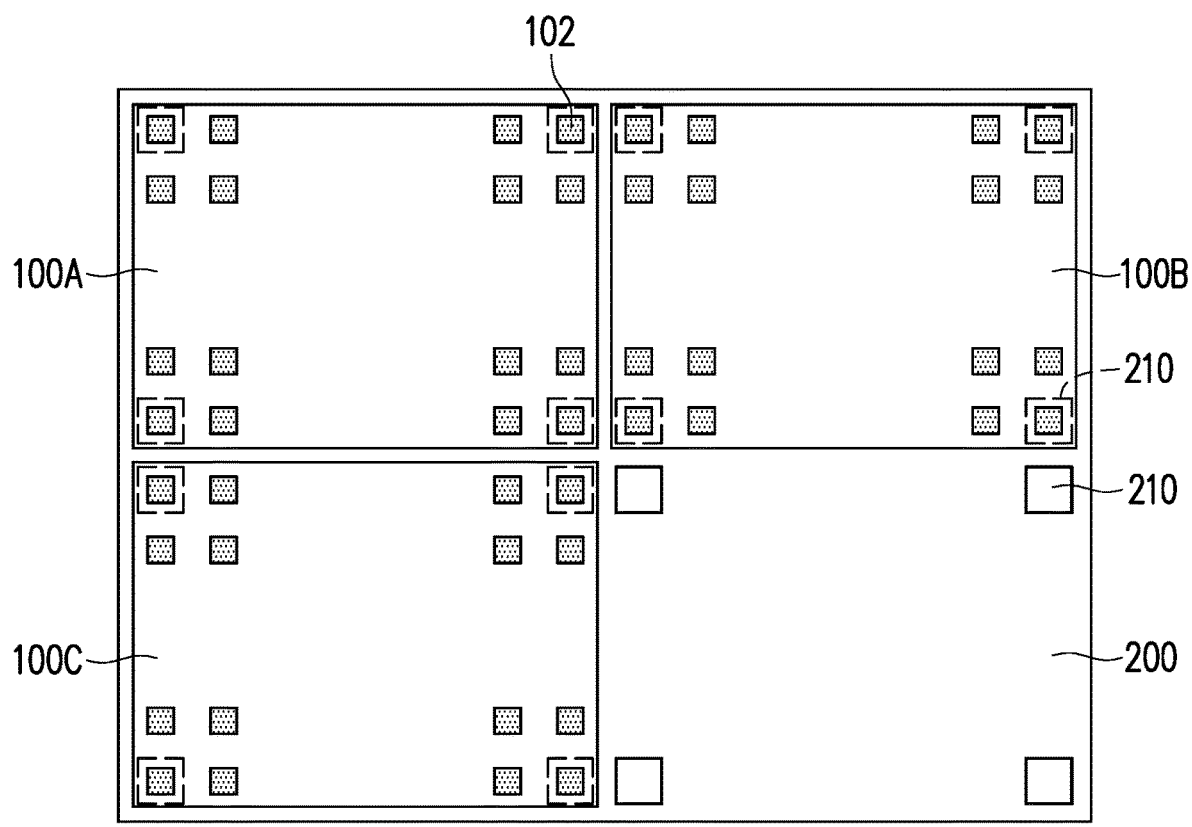
FIG. 3 is a schematic top view of a method of manufacturing a tiled display device according to an embodiment of the disclosure.

FIG. 1 is a flow chart illustrating the steps of a method of manufacturing a tiled display device according to an embodiment of the disclosure. FIG. 2 is a schematic top view of a base according to an embodiment of the disclosure. FIG. 3 is a schematic top view of a method of manufacturing a tiled display device according to an embodiment of the disclosure.

With reference to FIG. 1, FIG. 2 and FIG. 3, firstly, Step S10 is performed, in the Step S10, a plurality of display panels, such as display panels 100A, 100B and 100C, are provided. The display panels 100A, 100B and 100C may include a plurality of light emitting units 102. The plurality of display panels may provide a plurality of display images. A number of the plurality of display panels as illustrated in FIG. 3 should not be construed as a limitation to the disclosure. The number of the plurality of display panels can be adjusted according to practical operations.

Next, Step S20 is performed, in the Step S20, a plurality of alignment marks 210 are provided. At least a portion of the plurality of alignment marks 210 can be located on a base 200, the base may be used to support the plurality of display panels, such as display panels 100A, 100B and 100C as illustrated in FIG. 3. At least a portion of the plurality of alignment marks 210 can be located on the plurality of display panels, and the plurality of alignment marks 210 which are located on the plurality of display panels may be used to match the plurality of alignment marks 210 located on the base 200 for supporting the plurality of display panels. More particularly, the plurality of alignment marks located on the plurality of display panels can be the alignment marks additionally made on the substrate during the same process of at least one layers of the driving structure, or mark patterns originally exist on the light emitting units 102 on the substrate of the plurality of display panels. A number or a shape of the alignment marks 210 as illustrated in FIG. 2 and FIG. 3 should not be construed as a limitation to the disclosure, as long as the alignment marks 210 can achieve the effect of the disclosure. The number and the shape of the alignment marks 210 can be adjusted according to practical operations. For instance, the shape of the alignment marks 210 can not only be squares, but also circles or diamonds, but the disclosure should not be limited thereto. More particularly, the base 200 may be a stage, a carrier substrate, a protective substrate or a QDCF (Quantum Dot Color Filter) substrate, but the disclosure is not limited thereto. The method of forming alignment marks 210 of the base 200 may include lithography process or laser process, but the disclosure is not limited thereto. The alignment marks 210 can be formed on the base 200 by lithography process, or the alignment marks 210 can be formed in the base 200 by laser process, for instance.

After the Step S20, Step S12 is performed, in the Step S12, the plurality of display panels, such as display panels 100A, 100B and 100C, are tiled with reference to the plurality of alignment marks 210. More particularly, the tiling of the plurality of display panels can be performed by aligning each of the plurality of display panels with reference to at least one of the plurality of alignment marks 210. For instance, the plurality of display panels, such as display panels 100A, 100B and 100C as illustrated in FIG. 3, can be aligned one by one with reference to at least one of the plurality of alignment marks 210, or at least two of the plurality of display panels can be aligned at the same time with reference to at least one of the plurality of alignment marks 210. The definition of "at the same time" means that the alignment is completed in the same step or in the same order. The number of display panels aligned each time can be adjusted according to practical operations, the method of the disclosure may be suitable for multi-panel arrangement. In addition, the tiling of the display panels can be performed by aligning each of the display panels with reference to the alignment marks on the base, the risk of cumulative shift of the panel can be efficiently reduced.

Figure 4:
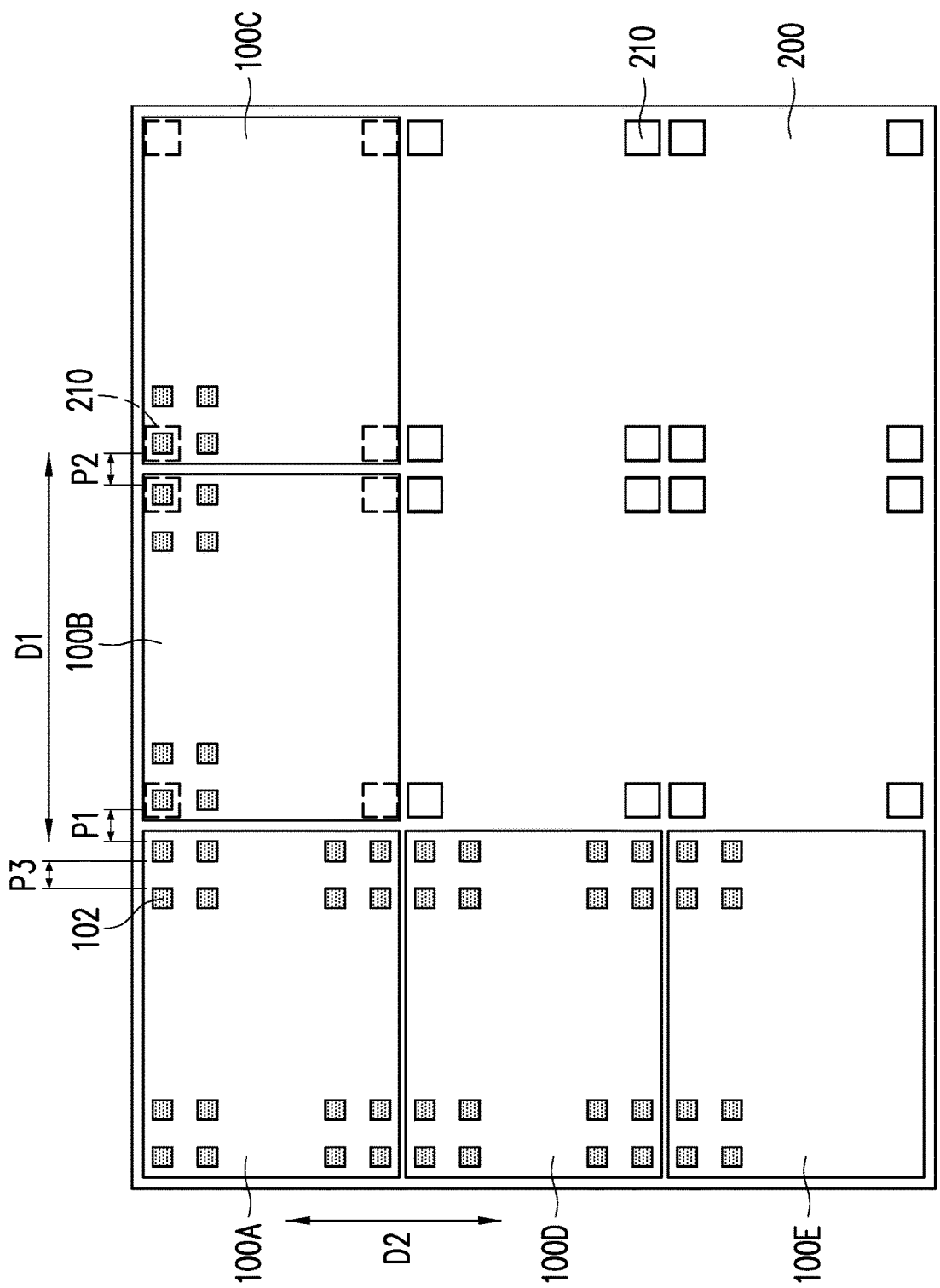
FIG. 4 is a schematic top view of a method of manufacturing a tiled display device according to another embodiment of the disclosure.

FIG. 4 is a schematic top view of a method of manufacturing a tiled display device according to another embodiment of the disclosure.

With reference to FIG. 1 and FIG. 4, when the Step S12 is performed, the plurality of display panels, such as display panels 100A, 100B, 100C, 100D and 100E as illustrated in FIG. 4, are tiled with reference to the plurality of alignment marks 210. A number of the display panels should not be construed as a limitation to the disclosure. The number of the display panels can be adjusted according to practical operations. The alignment marks 210 can be so arranged that the plurality of display panels can be tiled to make the same interpitches, such as P1 and P2, in at least one direction D1. In the embodiment, the definition of "interpitches" means a closest distance between two closest light emitting units 102 in any two adjacent display panels. These two closest light emitting units 102 can be two light emitting units of the same color or different colors. For instance, as for RGB (red, green, blue) chips, the definition of "interpitches" means the closest distance between two light emitting units 102 of the same color in display panels 100A and 100B. The definition of "same interpitches" means that the difference of |P2−P1| is less than or equal to P1/10. The direction D1 of the same interpitches P1 and P2 as illustrated in FIG. 4 should not be construed as a limitation to the disclosure. The definition of interpitches in direction D2 is similar to the definition of interpitches in direction D1. In other words, the interpitches in at least one direction may be the same no matter whether the direction is D1 or D2, but no limited thereto. The interpitches in direction D1 or D2 can also be the same as pitches of the plurality of display panels, so that the conformity of the picture can be higher when driving the tiled electronic device. The definition of "the pitches of the plurality of display panels" means the closest distance between two light emitting units 102 of the same color in one of the plurality of display panels. For example, as shows in FIG. 4, a pitch P3 in the direction D1 is the pitch of the display panel 100A, and the interpitch P1 or P2 in direction D1 or D2 can be the same as pitch P3 of the plurality of display panels. The definition of "the interpitch P1 or P2 is the same as pitch P3" means that the difference of |P3−P1| is less than or equal to P1/10 or the difference of |P3−P2| is less than or equal to P2/10. The tiling of the display panels 100A, 100B, 100C, 100D and 100E can be performed by aligning each of the display panels 100A, 100B, 100C, 100D and 100E with reference to the alignment marks 210 on the base 200, so the risk of cumulative shift of the display panel can be efficiently reduced.

Figure 5:
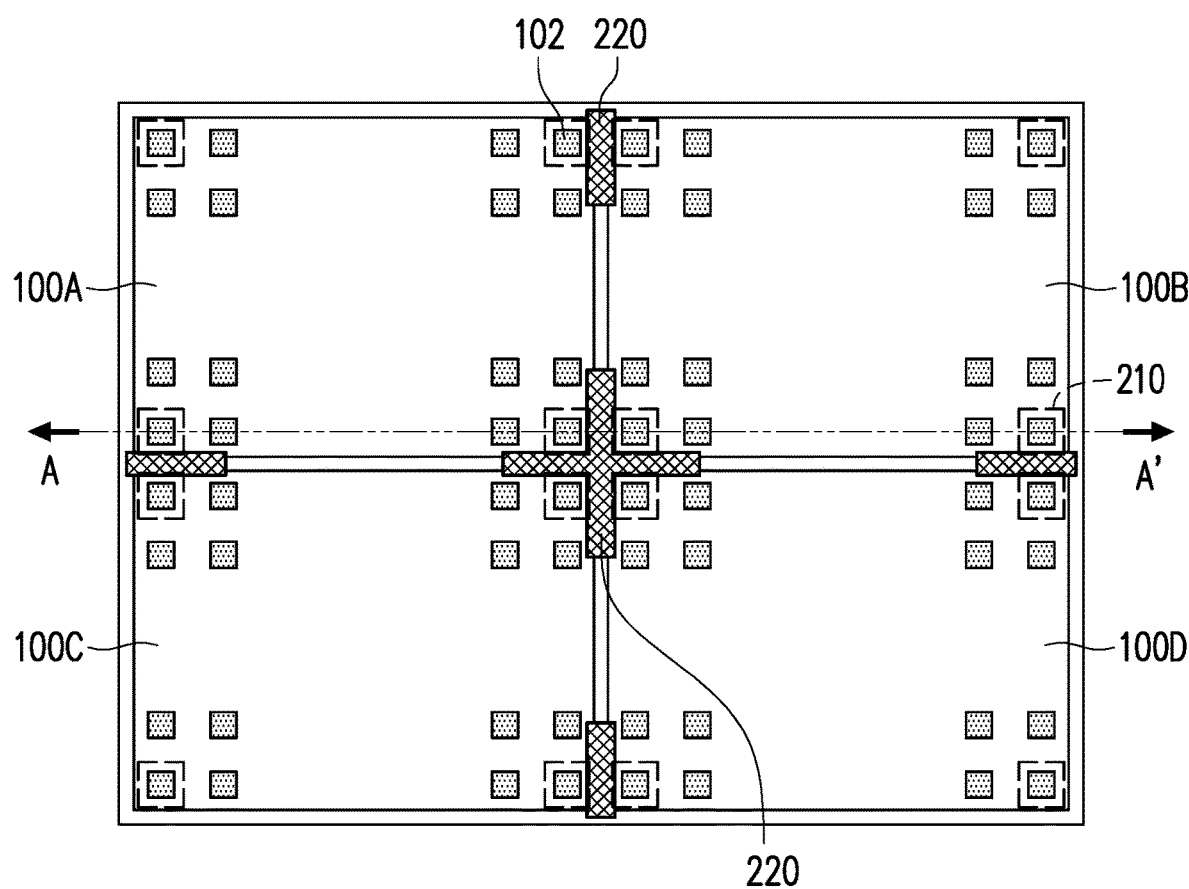
FIG. 5 is a schematic top view of a method of manufacturing a tiled display device according to an embodiment of the disclosure.
Figure 6:
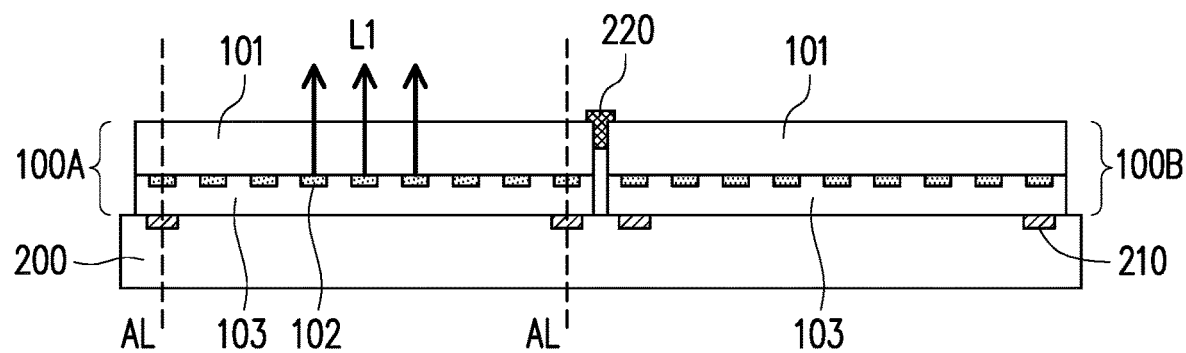
FIG. 6 and FIG. 7 are schematic cross-sectional views taken along a sectional line A-A' in FIG. 5.
Figure 7:
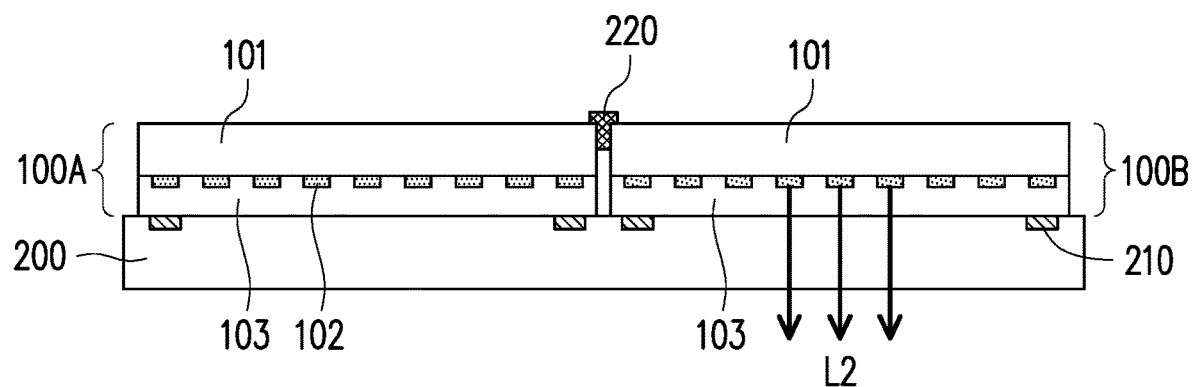

FIG. 5 is a schematic top view of a method of manufacturing a tiled display device according to an embodiment of the disclosure. FIG. 6 and FIG. 7 are schematic cross-sectional views taken along a sectional line A-A' in FIG. 5.

Afterwards, with reference to FIG. 1, FIG. 5, FIG. 6 and FIG. 7, Step S14 is performed, in the Step S14, the plurality of display panels are fixed by fixing member 220. The material of the fixing member 220 can include adhesive material, tape, or encapsulant (epoxy resin, silicon resin, acrylic resin, polyimide resin), but the disclosure is not limited thereto. As such, in one embodiment of the disclosure, the method of manufacturing a tiled display device is accomplished, and a tiled display device is obtained. Referring to FIG. 6, when the material of the base 200 includes glass, plastic or metal, the light L1 emits from the light emitting units 102 back to the base 200. The display panels 100A and 100B includes a substrate 101, a plurality of light emitting units 102 disposed on the substrate 101, a driving structure (not shown) disposed on the substrate 101, and a protecting film 103, respectively. The driving structure may be a thin film transistor structure for example, but not limit thereto. The plurality of light emitting units 102 can be driven by the driving structure. As for the embodiment shown in FIG. 6, the mark patterns originally exist on the light emitting units 102 are used as alignment marks to match the other alignment marks 210 located on the base 200. In other words, the alignment marks located on the plurality of display panels 100A and 100B can be the alignment marks additionally made on the substrate 101 during the same process of at least one layers of the driving structure, or mark patterns originally exist on the light emitting units 102 on the substrate 101 of the plurality of display panels 100A and 100B. A shape of the alignment marks is not limited, as long as the alignment marks can achieve the effect of the disclosure. The alignment of alignment marks 210 on the base 200 and the mark patterns on the light emitting units 102 can be center-to-center (as shown in FIG. 6, a line AL passes through a center of the alignment mark 210 on the base 200 and a center of the mark pattern on the light emitting units 102), edge-to-edge or other suitable alignment methods. Referring to FIG. 7, when the material of the base 200 includes transparent material, the light L2 emits from the light emitting units 102 and passes through the base 200. The transparent material may include glass, sapphire, polycarbonate, polyimide(PI), polyethylene terephthalate (PET), polyethylene naphthalate (PEN), cyclo olefin polymer (COP), or triacetyl cellulose (TAC), etc., for example.

Figure 8:
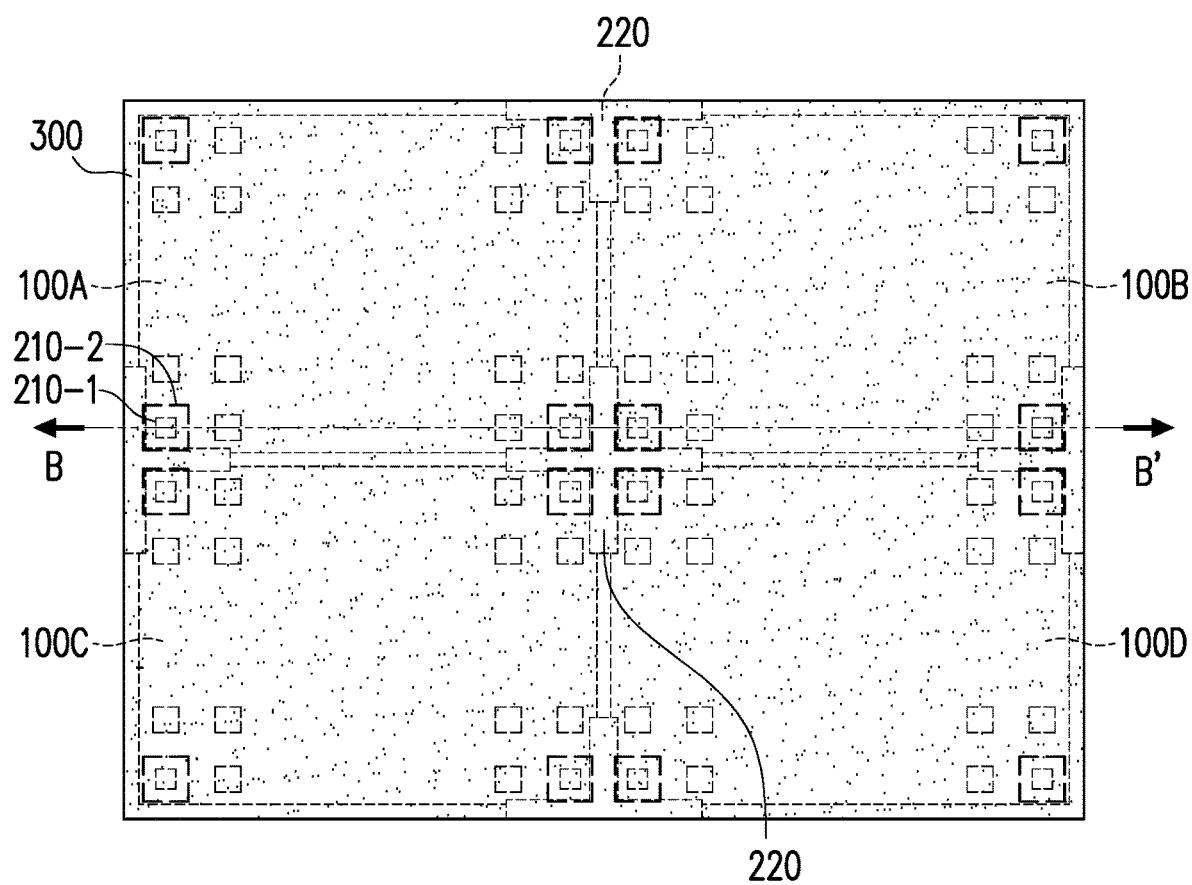
FIG. 8 is a schematic top view of a method of manufacturing a tiled display device according to an embodiment of the disclosure.
Figure 9:
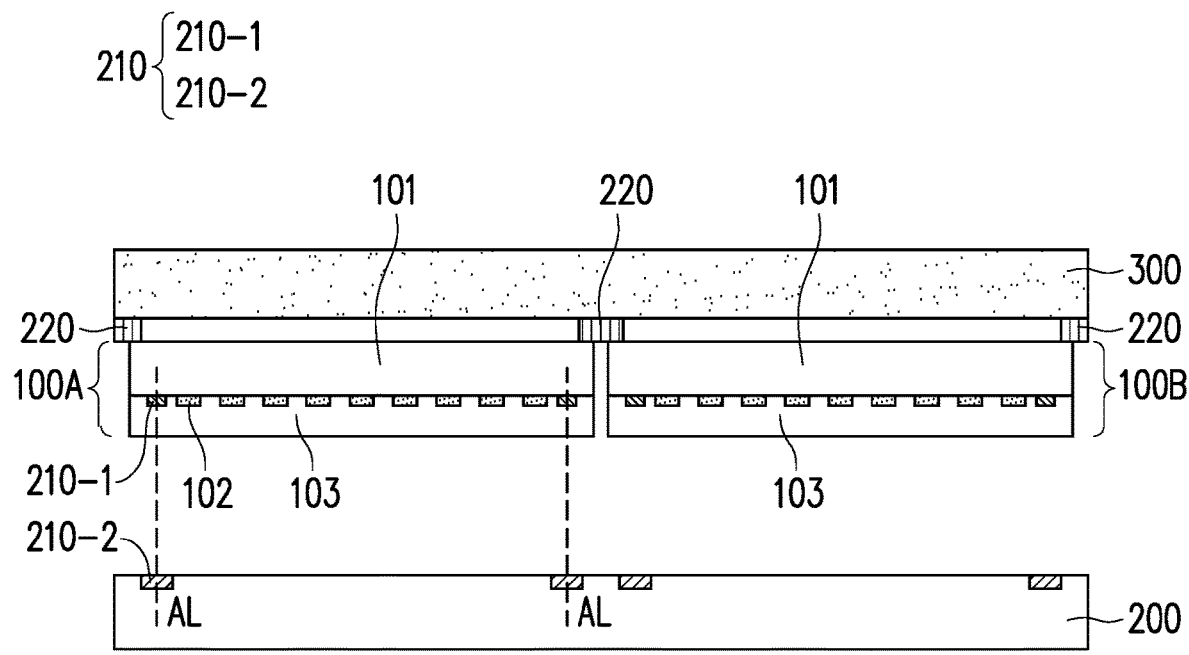
FIG. 9 and FIG. 10 are schematic cross-sectional views taken along a sectional line B-B' in FIG. 8.
Figure 10:
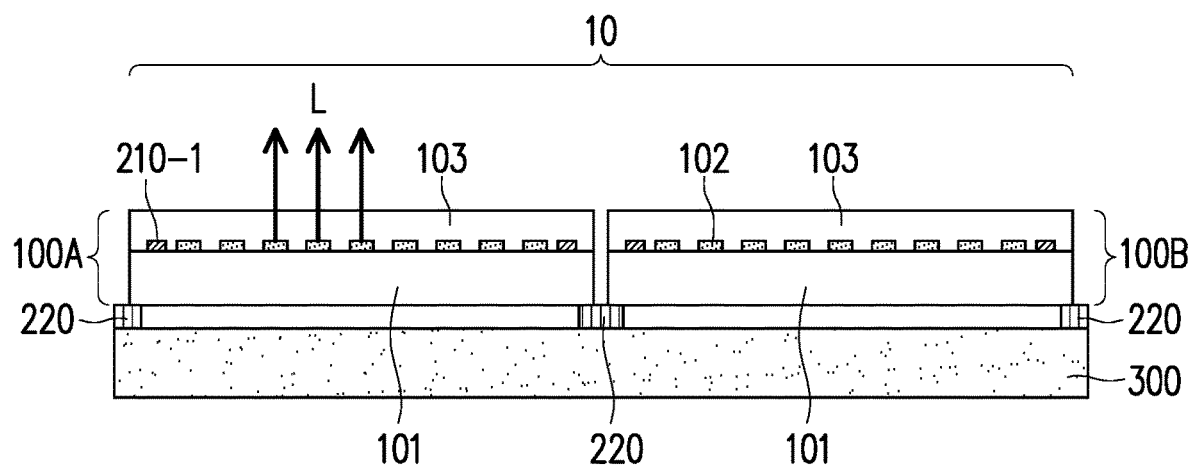

FIG. 8 is a schematic top view of a method of manufacturing a tiled display device according to an embodiment of the disclosure. FIG. 9 and FIG. 10 are schematic cross-sectional views taken along a sectional line B-B' in FIG. 8.

With reference to FIG. 1, FIG. 8, FIG. 9 and FIG. 10, in another embodiment, Step S30 is performed, in the Step S30, a mother substrate 300 is prepared. A material of the mother substrate 300 includes glass, plastic or metal. After the Step S30, Step S16 is performed, the mother substrate 300 is attached to the plurality of display panels, such as display panels 100A, 100B, 100C, and 100D as illustrated in FIG. 8 and FIG. 9, through fixing member 220. The material of the fixing member 220 can include adhesive material, tape, or encapsulant (epoxy resin, silicon resin, acrylic resin, polyimide resin), but the disclosure is not limited thereto. In the present embodiment, the alignment marks 210 includes portions 210-1 and 210-2. Portions 210-1 are alignment marks additionally made on the substrate 101 during the same process of at least one layers of the driving structure, and portions 210-2 are alignment marks located on the base 200. As shown in FIG. 8 and FIG. 9, the portions 210-1 on the substrate 101 are used to match the portions 210-2 located on the base 200. The alignment of the portions 210-1 on the substrate 101 and the portions 210-2 located on the base 200 can be center-to-center (as shown in FIG. 9, a line AL passes through a center of the portion 210-1 on the substrate 101 and a center of the portion 210-2 located on the base 200), edge-to-edge or other suitable alignment methods. Referring to FIG. 1 and FIG. 9, Step S18 is performed, the base 200 is separated from the mother substrate 300 and the plurality of display panels 100A and 100B, because the adhesion between the base 200 and the plurality of display panels may be weaker than the adhesion through attachment member 310 between the mother substrate 300 and the plurality of display panels due to adhesion material selection. More particularly, the method of separation includes 1) The display panels 100A and 100B are temporarily adhered to the base 200, and the base 200 can be separated from the mother substrate 300 and the plurality of display panels 100A and 100B by thermal processing or UV exposing or 2) The display panels 100A and 100B are temporarily fixed on the base 200 by vacuum, and the base 200 can be separated from the mother substrate 300 and the plurality of display panels 100A and 100B by closing the vacuum. As such, referring to FIG. 10, in another embodiment of the disclosure, the method of manufacturing a tiled display device is accomplished, and a tiled display device 10 is obtained. In the present embodiment, the upward light L emits from the light emitting units 102 of the display panels 100A and 100B, as shown in the direction of light L in FIG. 10. In other embodiments, the downward light L (the opposite direction of light L in FIG. 10) emits from the light emitting units 102 of the display panels 100A and 100B, and the emitted light L can passes through the mother substrate 300. In further another embodiments, the display panels 100A and 100B module can be turned upside down, so that the light L of the light emitting units 102 can pass through the mother substrate 300, but not limited thereto.

To sum up, the method of manufacturing the tiled display device of the disclosure tiles the display panels with reference to the alignment marks. Therefore, instead of aligning the display devices one by one, the method of the disclosure is able to efficiently reduce the risk of cumulative shift or more suitable for multi-panel arrangement. In addition, the plurality of display panels can be aligned one by one with reference to at least one of the plurality of alignment marks, or at least two of the plurality of display panels can be aligned at the same time with reference to at least one of the plurality of alignment marks. The number of display panels aligned each time can be adjusted according to practical operations, the multi-panel arrangement can be performed more efficiently. The tiled display device is only an example, and the disclosure could be applied to other electronic tiled device as mentioned above.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

The above embodiments merely serve to explain but not restrict the technical schemes provided in the disclosure. Although detailed descriptions are provided in detail with reference to the above embodiments, people having ordinary skill in the pertinent art should understand that the technical schemes described in the foregoing embodiments may be modified, or some or all of the technical features above may be equivalently replaced; these modifications or replacement may be provided without departing from the scope provided in one or more embodiments in the disclosure.

Although the embodiments and the advantages have been disclosed above, it should be understood that any person with ordinary skill in the pertinent art may make changes, substitutions, and refinements without departing from the spirit and scope of the disclosure. In addition, the scope of protection provided in the disclosure is not limited to the processes, machine, fabrications, compositions of substances, devices, methods, and steps provided in one or more embodiments described herein. People having ordinary skill in the pertinent art are able to understand the processes, machine, fabrications, compositions of substances, devices, methods, and steps provided in one or more embodiments developed at present or in the future, as long as the same function can be performed or the same result can be achieved according to the embodiments described in the disclosure. Accordingly, the scope of protection of the disclosure includes the above-mentioned processes, machine, fabrications, and compositions of substances, devices, methods, and steps. In addition, each claim constitutes an individual embodiment, and the scope of the disclosure also includes the combination of the various claims and embodiments. The scope of protection of the disclosure is subject to what is defined in the appended claims. Any embodiment or claim of the disclosure is not required to achieve all the objectives, advantages, and features disclosed herein.

What is claimed is:

1. A method of manufacturing a tiled display device, comprising:
   providing a plurality of display panels;
   providing a plurality of alignment marks, wherein at least a portion of the plurality of alignment marks are located on a base for supporting the plurality of display panels, and the base is a color filter substrate; and
   tiling the plurality of display panels with reference to the plurality of alignment marks;
   wherein the alignment marks are so arranged that the display panels are tiled to make all the same interpitches.

2. The method of claim 1, wherein at least a portion of the plurality of alignment marks are located on the plurality of display panels.

3. The method of claim 1, wherein the interpitches are the same as pitches of the plurality of display panels.

4. The method of claim 1, wherein the tiling of the plurality of display panels is by aligning each of the plurality of display panels with reference to at least one of the plurality of alignment marks.

5. The method of claim 4, wherein the plurality of display panels are aligned one by one.

6. The method of claim 4, wherein at least two of the plurality of display panels are aligned at the same time.

* * * * *